United States Patent [19]

Sauer

[11] 4,359,693
[45] Nov. 16, 1982

[54] FULL WAVE AMPLITUDE MODULATION DETECTOR CIRCUIT

[75] Inventor: Don R. Sauer, San Jose, Calif.

[73] Assignee: National Semiconductor Corporation, Santa Clara, Calif.

[21] Appl. No.: 187,006

[22] Filed: Sep. 15, 1980

[51] Int. Cl.³ .............................................. H03D 1/18
[52] U.S. Cl. ..................................... 329/101; 329/166
[58] Field of Search ....................... 329/101, 164, 166; 455/202-204, 337; 179/1 GS

[56] References Cited

U.S. PATENT DOCUMENTS 4,250,457 2/1981 Hofmann ............................. 329/101

FOREIGN PATENT DOCUMENTS 53-34451 3/1978 Japan ................................... 329/101

Primary Examiner—Siegfried H. Grimm
Assistant Examiner—Edward P. Westin
Attorney, Agent, or Firm—Gail W. Woodward; James A. Sheridan; Neil B. Schulte

[57] ABSTRACT

A current comparator is supplied with differential currents based upon an amplitude modulated radio frequency carrier. The comparator outputs are summed in a combining stage the output of which will contain a direct current proportional to the average carrier level and a current variation which represents the carrier modulation. The circuit provides very efficient detection of the modulated carrier.

8 Claims, 2 Drawing Figures

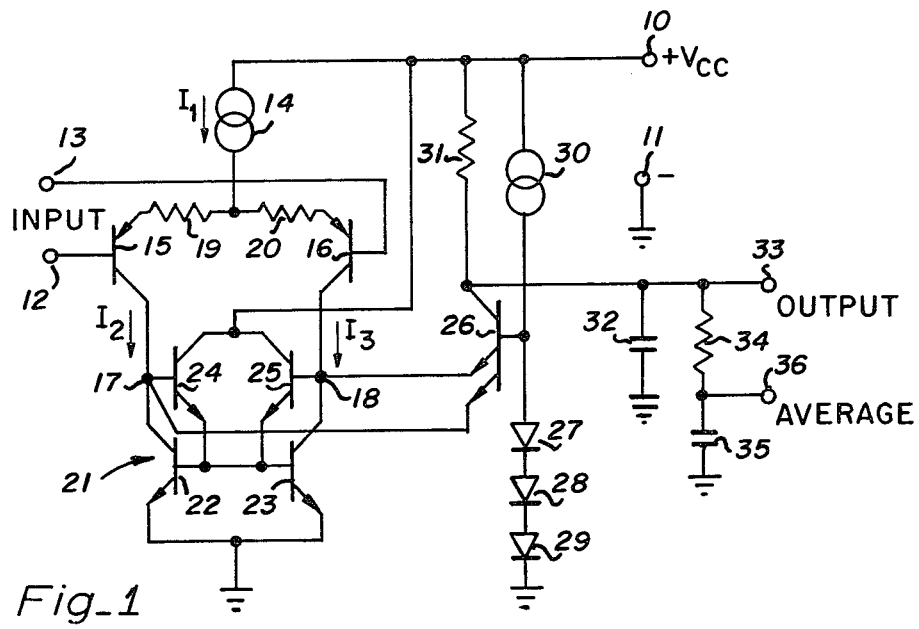
Fig_1
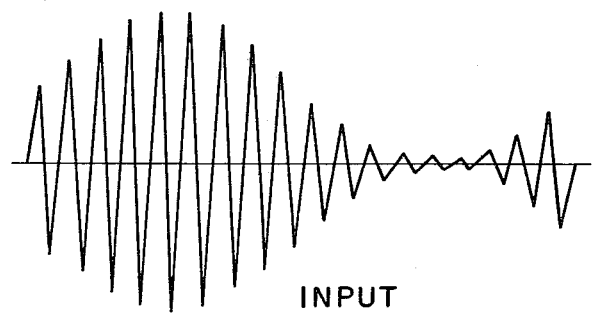
INPUT
Fig_2
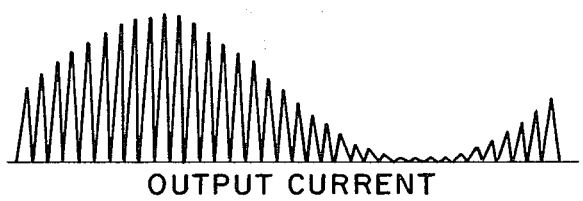
OUTPUT CURRENT
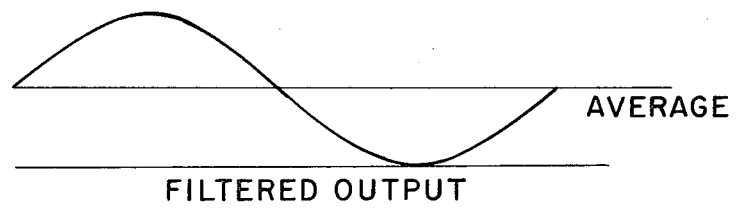
AVERAGE
FILTERED OUTPUT

FULL WAVE AMPLITUDE MODULATION DETECTOR CIRCUIT

BACKGROUND OF THE INVENTION

In my U.S. Pat. No. 4,069,460 which was issued Jan. 17, 1978, to the assignee of the present invention, a balanced current comparator is disclosed. The present invention makes use of that comparator to provide an amplitude modulated (AM) carrier wave detector. The detector has utility in AM radio receivers as a precision full wave detector. In particular, it has utility in AM stereo radio receivers where precision rectification is needed. Most present AM stereo radio receivers employ a conventional diode AM detector which acts as a peak rectifier. Such detectors must be operated at a high-signal level to avoid nonlinearities, and therefore, tend to produce carrier signal radiation. The peak rectification characteristic also makes them responsive to impulse noise. A suitable detector should be relatively immune to noise, produce as low radiation as possible, precisely rectify the AM carrier, and provide a carrier related direct-current (d-c) output.

SUMMARY OF THE INVENTION

It is an object of the invention to provide a detector circuit which acts as a full wave rectifier and is amenable to integrated circuit (IC) fabrication.

It is a further object of the invention to provide an AM detector circuit having full wave output and highly precise rectification.

It is a still further object of the invention to provide an AM detector circuit based upon a current comparator which has its outputs summed in a precision rectifier configuration which provides outputs precisely related to the AM carrier and the carrier modulation.

These and other objects are achieved in a circuit configured as follows. An AM carrier wave signal is applied to a differential input stage which is coupled to a current comparator having a pair of input nodes. This comparator is configured to have a very small deadband range. The two nodes are coupled to a current summing stage, the output of which will contain current pulses that represent a full wave rectified version of the AM carrier. A low pass filter having an RF filter characteristic will yield the carrier modulation. A second low pass filter having a modulation filter characteristic will yield a dc voltage related to the carrier average value.

BRIEF DESCRIPTION OF THE DRAWING

FIG. 1 is a schematic diagram of the circuit of the invention.

FIG. 2 is a series of graphs portraying the signals related to the operation of the circuit of FIG. 1.

DESCRIPTION OF THE INVENTION

FIG. 1 shows the circuit of the invention in a form amenable to IC fabrication. A source of operating potential is connected between the +Vcc terminal 10 and ground terminal 11 as shown. Input terminals 12 and 13 are supplied with an AM carrier such as the one shown in FIG. 2. This signal would typically be obtained from the intermediate frequency stage of an AM radio receiver (not shown). Current source 14 provides current $I_1$ to differential pair transistors 15 and 16 such that nodes 17 and 18 are supplied with differentially related currents $I_2$ and $I_3$. Thus $I_2 = I_2 + I_3$ and the FIG. 2 output showing represents $|I_2 - I_3|$. Resistors 19 and 20 act to degenerate transistors 15 and 16 and can be employed to regulate the circuit temperature compensation.

Nodes 17 and 18 are coupled to symmetrical current mirror 21 which is made up of transistors 22 thru 25. Current mirror 21 operates as disclosed in my U.S. Pat. No. 4,069,460, referenced above, and acts to vary the voltages at nodes 17 and 18 in accordance with the input signal at terminals 12 and 13. Transistor 26 is shown as a dual emitter device with the emitters coupled to nodes 17 and 18. However transistor 26 could be two separate transistors with their collectors and bases commonly connected.

Diodes 27 thru 29 forward biased by current source 30, bias the base of transistor 26 at 3 $V_{BE}$ above ground. While not shown, diodes 27 thru 29 could be realized using the emitter-base diodes of NPN transistors. Since current mirror 21 biases nodes 17 and 18 at 2 $V_{BE}$ above ground, transistor 26 will be conductive and responsive to the input signal. FIG. 2 portrays the output current supplied by transistor 26 in load resistor 31. It can be seen that the circuit operates as a frequency doubling full wave rectifier.

Capacitor 32 is selected along with resistor 31 to provide a low pass filter that effectively removes the R-F carrier while leaving the modulation signal at output terminal 33. Resistor 34 and capacitor 35 form a second low pass filter that removes the modulation signal and provides a d-c output at average terminal 36. This d-c output provides an R-F carrier related signal for automatic gain control use in the related AM radio (not shown).

It can be seen that as the emitters of transistor 26 are driven negatively, conduction will increase, whereas, as they are driven positively the transistor action cuts off. This is the mechanism that produces signal rectification. However, the bias on transistor 26 can be likened to class AB amplifier transfer operation. This provides a characteristic that avoids a deadband in the signal transfer. This produces a linear transfer over a large dynamic range and avoids the distortion that would ordinarily accompany the modulation troughs, particularly for weak signals. Since nodes 17 and 18 always have associated shunt capacitance, such a deadband response can be aggravated particularly at the higher operating signal frequencies.

EXAMPLE

The circuit of FIG. 1 was constructed using conventional monolithic IC components. The NPN transistors were of standard vertical construction and the PNP transistors were of standard lateral construction. The following part values were employed:

| Part | Value | Units |
|---|---|---|
| Source 14 | 1 | milliamperes |
| Resistors 19 and 20 | 500 | ohms |
| Source 30 | 5 | microamperes |
| Resistor 31 | 2K | ohms |
| Capacitor 32 | .002 | microfarads |
| Resistor 34 | 8K | ohms |
| Capacitor 35 | 10 | microfarads |

The circuit had less than 1% distortion in detecting a 455 kHz signal modulated at 90%. The output at terminal 36 was linearly related to the average signal value.

The circuit of the invention has been described, and an operating example given for the IC version. When a person skilled in the art reads the foregoing, alternatives and equivalents, within the spirit and intent of the invention, will occur to him. For example, all of the transistors and diodes of FIG. 1 could be complemented and the power supply polarity reversed. Accordingly it is intended that the scope of the invention be limited only by the following claims.

I claim:

1. An amplitude modulation detector comprising:
   first and second supply terminals connectible to a source of operating power;
   a pair of circuit nodes;
   means coupled between said nodes and said first terminal for supplying differential currents to said nodes, said differential currents being related to an amplitude modulated radio frequency carrier wave;
   current mirror means having a common terminal and a pair of current terminals coupled between said nodes and said second supply terminal thereby to develop signals at said nodes related to said carrier wave; and
   means for combining said signals at said nodes to provide an output that is related to the modulation on said carrier wave wherein said means for combining comprises a two emitter transistor structure with said two emitters coupled to said nodes.

2. The detector of claim 1 wherein said current mirror includes level shifting means whereby said nodes operate at a potential above said second supply terminal potential and said two emitter transistor structure is biased so as to be conductive when its emitters are operated at said potential above said second supply terminal potential.

3. The detector of claim 2 wherein the collector of said two emitter transistor structure comprises the output of said detector.

4. The detector of claim 3 including first low pass filter means connected to the collector of said two emitter transistor structure, the output of said first low pass filter means containing signal information related to the modulation of said carrier wave.

5. The detector of claim 4 including second low pass filter means connected to the collector of said two emitter transistor structure, the output of said second low pass filter means containing signal information related to the average value of said carrier wave.

6. A detector circuit having a pair of differential input terminals for receiving a modulated radio frequency carrier wave signal and an output terminal for providing signal information related to the modulation of said carrier wave and the average value of said carrier wave, said circuit comprising:
   first and second supply terminals connectible to a source of operating power;
   first and second current nodes;
   first and second transistors of one conductibility type having their bases coupled to said differential input terminals, their emitters commonly coupled by way of current supply means to said first supply terminal and their collectors coupled respectively to said first and second nodes;
   third and fourth transistors complementary to said first and second transistors and having their emitters coupled in common to said second supply terminal, their collectors coupled to said first and second nodes respectively, and their bases coupled together;
   fifth and sixth transistors complementary to said first and second transistors and having their emitters coupled in common to said bases of said third and fourth transistors, their collectors coupled to said first supply terminal and their bases coupled respectively to said first and second nodes; and
   seventh and eighth transistors complementary to said first and second transistors with their emitters respectively coupled to said first and second nodes, their collectors coupled in common to said output terminal, and their bases coupled in common to a source of operating bias.

7. The circuit of claim 6 wherein said seventh and eighth transistors are a single dual emitter transistor structure.

8. The circuit of claim 6 wherein said first and second transistors are PNP and said third through said eighth transistors are NPN.

* * * * *